United States Patent

[11] 3,619,803

[72] Inventor Arthur Harold Klein
Batavia, N.Y.

[21] Appl. No. 19,650
[22] Filed Mar. 16, 1970
[45] Patented Nov. 9, 1971
[73] Assignee GTE Sylvania Incorporated

[54] TEMPERATURE AND VOLTAGE COMPENSATION FOR TRANSISTORIZED VCO CONTROL CIRCUIT

11 Claims, 3 Drawing Figs.

[52] U.S. Cl. .................................................. 331/8, 178/5.4 SY, 325/420, 325/422, 325/423, 331/17, 331/20, 331/26, 331/36 C, 331/177 V

[51] Int. Cl. .................................................. H03b 3/04, H04n 9/44

[50] Field of Search .................................................. 331/8, 17, 20, 25, 26, 36 C, 177 V; 178/5.4 SY; 325/419–423

[56] References Cited

UNITED STATES PATENTS

| | | | |
|---|---|---|---|
| 2,768,296 | 10/1956 | Herzog .......................... | 331/20 X |
| 2,953,636 | 9/1960 | Kelly .......................... | 178/5.4 SY |
| 3,078,421 | 2/1963 | Heuer et al. .......................... | 331/17 |
| 3,303,430 | 2/1967 | Pratt .......................... | 331/20 |
| 3,321,712 | 5/1967 | Frisch et al. .......................... | 331/17 X |

*Primary Examiner*—Roy Lake
*Assistant Examiner*—Siegfried H. Grimm
*Attorneys*—Robert E. Walrath and Edward J. Coleman

ABSTRACT: Compensation for the effects of both ambient temperature and supply voltage variations upon a transistorized DC amplifier delivering a control voltage to the varactor frequency determining element of a voltage-controlled oscillator is provided by a regulator transistor connected to provide a source of reference potential for the varactor and a source of base bias voltage for the DC amplifier, whereby temperature of supply voltage induced changes in the output voltage of the DC amplifier and the reference potential provided by the regulator tend to track each other so as to stabilize the voltage difference across the varactor. In a phase lock loop application, the bias voltage provided by the regulator is applied through a phase detector to the input base electrode of the DC amplifier so as to utilize the high-impedance properties of the phase detector at the amplifier input.

INVENTOR.
ARTHUR H. KLEIN
BY
Robert E. Walrath
ATTORNEY

TEMPERATURE AND VOLTAGE COMPENSATION FOR TRANSISTORIZED VCO CONTROL CIRCUIT

BACKGROUND OF THE INVENTION

This invention relates generally to temperature or voltage compensation circuits and, more particularly, to improved means for providing compensation for the effects of ambient temperature and supply voltage variations upon a transistorized DC control voltage amplifier for a voltage-controlled oscillator.

The use of semiconductor devices such as germanium or silicon transistors and diodes in frequency control circuits, although providing the advantages of greater component reliability and reduced size, poses the significant problem of maintaining a reasonable degree of frequency stability in view of the sensitivity of the semiconductor components to changes in temperature and line voltage. For example, consider a typical transistorized phase lock loop comprising a voltage-controlled oscillator (VCO) adapted to be controlled in phase and frequency, a phase detector having a first input connected to a feedback path from the oscillator output and a second input connected to a reference frequency signal source, and a transistorized direct current (DC) amplifier connected between the output of the phase detector and the control element of the oscillator. If there is a phase difference between the reference and feedback signals, the phase detector generates a DC voltage error signal which is applied via the DC amplifier to phase correct the oscillator to achieve phase lock with the reference signal. In such a phase lock loop configuration, the most critical circuit element with respect to frequency stability under temperature and line voltage variations is the transistorized DC control voltage amplifier. In particular, an increasing ambient temperature has the effect of decreasing the collector output voltage of the thermal sensitive DC amplifier, thereby reducing the control voltage applied to the oscillator below its proper level; the typical frequency drift due to this effect in an uncompensated phase lock loop would be approximately 300 Hz. for a 30° C. change in ambient temperature. A line voltage fluctuation, on the other hand, causes a variation in the collector supply voltage provided to the DC amplifier, whereby an increase in supply voltage causes a proportional increase in the control voltage applied to the oscillator, the typical frequency drift due to a supply voltage variation being approximately 100 Hz. per volt.

In view of the frequency drift problems introduced by use of a transistorized amplifier in the DC control circuit of a VCO, it is apparent that some means is required to compensate for the adverse effect of both temperature and supply voltage variations. The conventional prior art approach would be to employ a zener diode in the supply voltage source to provide voltage compensation and to connect one or more thermistors or semiconductor diodes in the transistor amplifier bias circuitry to provide temperature compensation. Although such compensating methods are capable of providing adequate frequency stability, the use of two substantially independent compensating circuits is a relatively costly solution to the problem from the standpoint of both component cost and difficulty of achieving an optimum compromise between temperature and voltage compensation.

SUMMARY OF THE INVENTION

Accordingly, it is an object of the present invention to provide an improved temperature- and voltage-compensating means for a transistorized amplifier.

It is another object of the invention to provide compensation for the effects of ambient temperature and supply voltage variations upon a transistorized DC control voltage amplifier for a voltage control oscillator by the use of a single auxiliary circuit.

It is a further object of the invention to provide an inexpensive and relatively easily adjusted temperature and voltage compensation means for a transistorized phase lock loop.

Briefly, these objects are attained in one aspect of the invention by employing in combination with a transistorized DC amplifier energized by a source of supply voltage and connected between a source of input voltage and a load, an ambient temperature and supply voltage compensating circuit comprising a transistorized regulator energized by the supply voltage source and having an output terminal connected to the reference terminal of the load. In addition, the output of the regulator is connected via circuit means as a source of bias voltage for the DC amplifier.

In another aspect of the invention, the compensating circuit is connected in combination with a transistorized DC amplifier energized by a source of supply voltage and connected between a source of input voltage and the control terminal of a voltage responsive variable reactance means included in the phase and frequency control circuitry of a voltage-controlled oscillator. In this instance, the compensating circuit comprises a transistor regulator energized by the supply source and having an output terminal connected to the reference terminal of the variable reactance means and to provide a source of bias voltage for the DC amplifier. The gain of the transistor regulator is selected to maintain a substantially constant voltage difference across the control and reference terminals of the variable reactance means over selected ranges of supply voltage and ambient temperature variations when the input voltage source is constant.

In yet another aspect of the invention, the compensated voltage-controlled oscillator circuit described in the previous paragraph is applied in a phase lock loop including a phase detector having a first input coupled to obtain a feedback signal from the output of the oscillator, a second input connected to a reference signal source, and an output connected to the input of the transistorized DC amplifier. In this case, the circuit means for providing a bias voltage to the DC amplifier comprises means connecting the output of the regulator transistor to the first input of the phase detector, a DC circuit path through the phase detector from its first input to its output, and the connection of the output of the phase detector to the input of the DC amplifier. This compensated phase lock loop is particularly useful when connected in a color television receiver operative to receive a color television signal requiring synchronous demodulation by a chromaticity-demodulating signal of a given phase and frequency represented by a burst component in the television signal. In this application, the reference signal applied to the second input of the phase detector is derived from the received burst component, with the chromaticity-demodulating signal being obtained at the output of the oscillator.

BRIEF DESCRIPTION OF THE DRAWINGS

This invention will be more fully described hereinafter in conjunction with the accompanying drawings, in which.

DESCRIPTION OF PREFERRED EMBODIMENT

For a better understanding of the present invention together with other and further objects, advantages and capabilities thereof, reference is made to the following disclosure and appended claims in connection with the above-described drawings.

The present invention basically comprises means for compensating for the effects of supply voltage and ambient temperature variations upon a transistorized DC amplifier. Such compensation becomes particularly necessary in applications where the transistorized amplifier is employed in the control voltage signal path to the control terminal of a voltage-controlled oscillator (VCO). As a phase lock loop provides one of the more common applications of a VCO, the compensating circuit of the invention is described in that context.

Figures 1, 3:
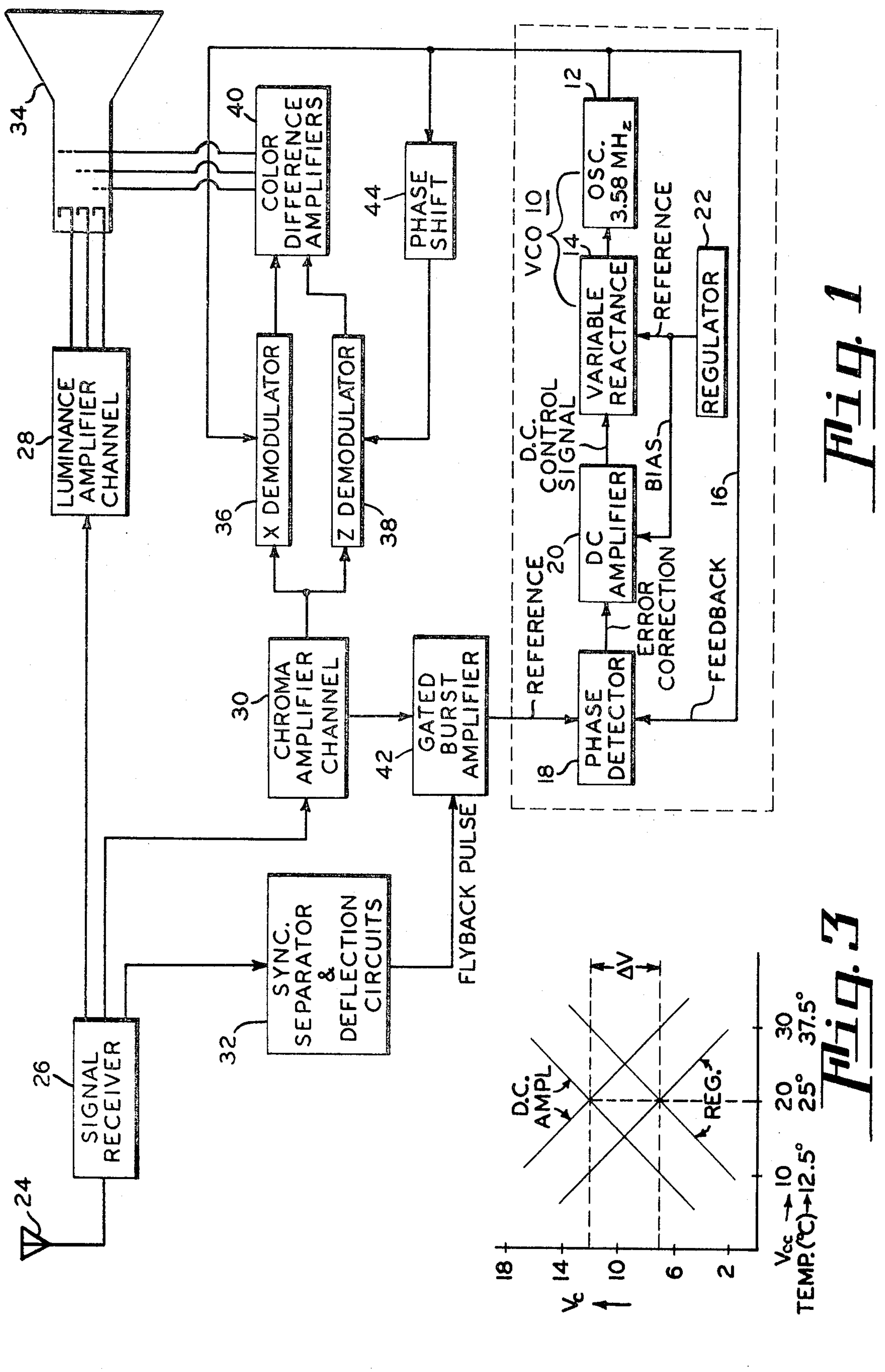
FIG. 1 is a block diagram of a color television receiver employing a phase lock loop which includes temperature and voltage compensation means in accordance with the invention.
FIG. 3 is a generalized graph illustrating the variation of pertinent transistor output voltages ($V_c$) with changes in supply voltage ($V_{cc}$) and ambient temperature.
Figure 2:
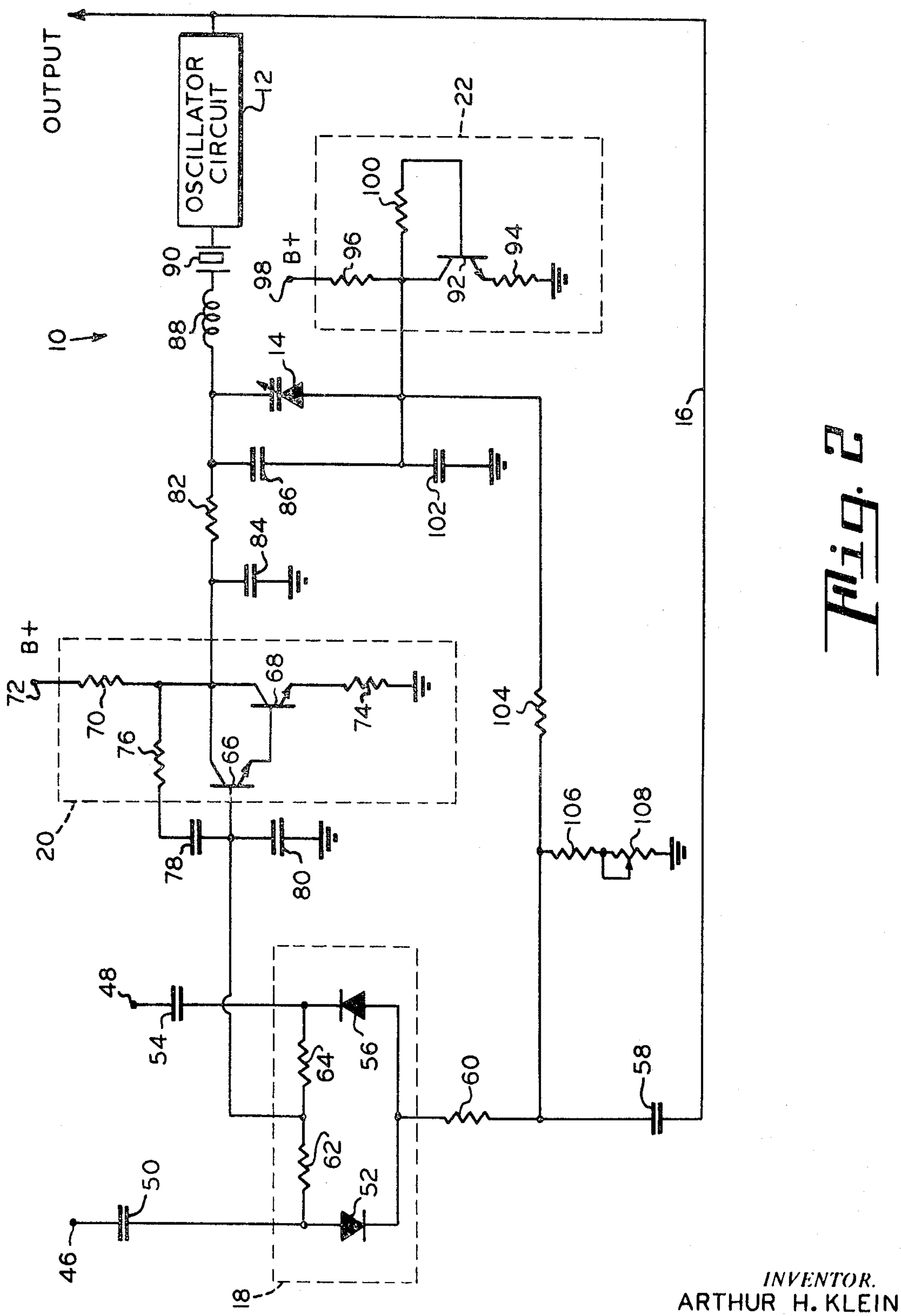
FIG. 2 is a schematic diagram of a phase lock loop including temperature- and voltage-compensating means in accordance with the invention.

Referring to the portion of the FIG. 1 block diagram within the dashed-line rectangle and the schematic diagram of FIG. 2, a typical phase lock loop comprises a voltage-controlled oscillator (VCO) 10 including an oscillator circuit 12 and a voltage responsive variable reactance means 14, such as a varactor as illustrated in the schematic which is connected as part of the phase- and frequency-determining circuitry of the VCO. The output of the oscillator is coupled by means of a feedback path 16 to one input of a phase detector 18. A reference signal is applied to the second input of the phase detector, and the output of detector 18 is connected via a DC amplifier 20 to the control input of the variable reactance means 14. In operation, the phase detector is responsive to an undesired difference in phase between the reference signal and feedback signal to produce an error correction voltage which is applied via amplifier 20 as a control signal for variable reactance 14. The variable reactance thereupon varies the phase or frequency of oscillator 12 as a function of the magnitude and direction of the applied control voltage signal. In this manner, the error correction control signal continues to steer the VCO toward a desired phase-locked condition with the reference signal.

In accordance with the invention, both temperature and voltage compensation for the phase lock loop are provided by a single auxiliary circuit. In particular, a transistorized regulator 22 is employed which is energized by the same source of supply voltage energizing amplifier 20 and provides an output voltage which is used as the reference potential for variable reactance 14 and as the bias source for DC amplifier 20. Thus, if a change in supply voltage causes a variation in the control signal voltage at the output of amplifier 20, the output voltage of transistorized regulator 22 will be effected in a similar manner. As the output of amplifier 20 is applied to the input control terminal of the variable reactance 14, while the output of regulator 22 is connected to its reference terminal, the voltage difference across the input and reference terminals of variable reactance 14 will tend to be stabilized. The supply-varied bias voltage applied by the regulator to DC amplifier 20 functions in cooperation with proper respective gain selection of amplifier 20 and regulator 22 to keep the voltage at the input of the variable reactance in track with the voltage at the reference terminal thereof so that the two voltages vary in parallel with supply voltage changes.

In like manner, as amplifier 20 and regulator 22 are both thermal sensitive semiconductor circuits, both circuits will be affected in a similar manner by changes in the ambient temperature. Hence, a temperature-induced change in the output voltage of amplifier 20 applied as a control signal to the input terminal of variable reactance 14 will be matched by a similar temperature-induced change in the output of regulator 22 applied as a reference potential for the variable reactance. As was the case with changes in supply voltage, this arrangement together with the tracking maintained between the variable reactance input and reference of voltages by the bias applied to amplifier 20 tends to stabilize the voltage across the variable reactance in the face of a range of ambient temperature variations.

Accordingly, when a relatively constant error correction voltage is applied to the input of DC amplifier 20 by the phase detector, the temperature and/or supply voltage induced changes in the control signal produced at the output of amplifier 20 are compensate for by the action of regulator 22 in maintaining a constant voltage difference across the variable reactance 14. As a result, the voltage-controlled oscillator 10 will be isolated from the temperature- and voltage-induced control signal variations and continue to operate in a stable manner producing the frequency determined (in part) by the voltage across variable reactance 14. If the phase detector comparison produces a variation in the error correction voltage applied at the input of amplifier 20, this proper variation in the control signal will be allowed to appear across the variable reactance to thereby correct the oscillator phase and frequency, as the operation of regulator 22 is not affected by the error correction voltage. The bias and reference voltage output provided by regulator 22 is affected only by changes in the ambient temperature and supply voltage and thus will compensate for only these undesired variations, whether the error correction voltage is constant or varying. In the case of a constant error correction voltage, this compensation is provided by maintaining a constant voltage difference across the variable reactance 14, whereas in the case of a varying error correction voltage, regulator 22 provides compensation against temperature or supply voltage induced accentuation or attenuation of the control signal.

The above-described compensated phase lock loop has numerous applications as readily will be recognized by those skilled in the art; an illustrative application for providing color synchronization in a color television receiver is shown in FIG. 1. With the exception of regulator 22, the circuit blocks depicted in FIG. 1 are well known and conventional elements of a colored television receiver. Antenna 24 is provided for intercepting the transmitted television signals and coupling these intercepted signals to a signal receiver 26 including a tuner, an intermediate frequency channel, a sound channel, and a video detector. The detected video signal output of receiver 26 is coupled to a luminance amplifier channel 28, a chroma amplifier channel 30, and a block 32 which includes suitable conventional forms of sync separator and horizontal and vertical deflection circuits. The luminance channel processes the brightness information obtained from the received signal and accordingly drives the cathode electrodes of a tricolor picture tube 34. Chroma amplifier 30 processes the chrominance information and accordingly drives a pair of synchronous detection circuits called an X-demodulator 36 and a Z-demodulator 38. The demodulated outputs of circuits 36 and 38 are applied to a set of color difference amplifiers, denoted by block 40, which provide control signals to the three-grid electrodes of the picture tube 34.

The X- and Y-demodulators are employed to derive R−Y (red minus luminence) information and B−Y (blue minus luminence) information, respectively, from a 3.579545 MHz. suppressed subcarrier modulated with chrominance information and forming a component of the standard colored television transmission. More specifically, this color subcarrier is both phase and amplitude modulated with I- and Q-signal information defining the hue and saturation of an image to be reproduced on the picture tube. To properly detect this color information, the X- and Z-demodulators must be supplied with a continuous wave-demodulating signal, sometimes referred to as the chromaticity-demodulating signal, which is synchronized in phase and frequency with the absent subcarrier. To ensure that such synchronism or coherence exists, the color transmission includes a periodically transmitted component, known as a "burst" signal, to serve as a phase and frequency reference for a locally generated 3.579545 MHz. subcarrier signal in the receiver. This burst component is transmitted during the horizontal blanking interval of the television signal and comprises approximately 9 cycles of a signal having the above-mentioned frequency of 3.579545 MHz. generally expressed in rounded-off form as 3.58 MHz. Conventionally, this burst reference signal is separated from the chrominance signal by means of a simple keyed gate circuit. It is convenient to derive the keying signal for burst separation from the deflection circuit of the television receiver since a modified form of the horizontal flyback pulse may be used for this purpose as it occurs during the horizontal blanking interval. It is also a conventional procedure to compare the local oscillation signal and the transmitted reference signal in a conventional phase detector to derive an error signal which adjusts the nominally tuned frequency of the local oscillator to the burst standard.

Accordingly, in FIG. 1, a video signal containing the burst component is obtained from one of the chroma amplifiers in channel 30 and applied to a gated burst amplifier circuit 42. Amplifier 42 is then periodically gated to conduct by flyback pulses obtained from the horizontal deflection circuitry in block 32 so that only the burst component of the received color signal is passed through amplifier 42. The 3.58 MHz. burst signal at the output of amplifier 42 is then applied as the reference input signal to phase detector 18 of the previously described compensated phase lock loop, which in this application is providing phase and frequency control of a 3.58 MHz. crystal controlled oscillator 12 functioning as the receiver local oscillator for providing the chromaticity-demodulating signal. The output of oscillator 12 is applied directly to the reference input of the X-demodulator 36 and through a 75-degree phase shift circuit 44 to the reference input of the Z-demodulator 38.

A preferred embodiment of a phase lock loop useful for providing a synchronized chromaticity-demodulating signal in the color receiver of FIG. 1, and employing a compensating circuit according to the invention, is illustrated schematically in FIG. 2. As mentioned above, the phase detector 18 must compare the color burst phase with the phase of the 3.58 MHz. voltage controlled oscillator 10 and provide a correction voltage to the variable reactance of the VCO to steer the oscillator toward the desired phase and frequency synchronization with the burst reference. Accordingly, the reference signal provided at the output of burst amplifier 42 is applied, generally by a transformer coupling, to phase detector input terminals 46 and 48, with the signal at terminal 46 being 180° out of phase with the signal at terminal 48. The terminal 46 input voltage is coupled through a capacitor 50 to the anode of a fast-recovery signal diode 52, while the signal at terminal 48 is applied through coupling capacitor 54 to the cathode of a diode 56. The junction of the cathode of diode 52 and the anode of diode 56 serves as the phase detector input terminal for the feedback signal returned from the output of oscillator circuit 12 via coupling capacitor 58 and a series resistor 60, selected to suppress harmonic generation in the diodes. A pair of resistors 62 and 64 are serially connected between the anode of diode 52 and the cathode of diode 56 to provide respective load resistances for the peak detection function provided by the diodes. The phase detector output is provided at the junction of resistors 62 and 64.

When the oscillator waveform is 9° out of phase with the burst reference signal, the voltages across the two diodes 52 and 56 are equal and "an in phase" condition exists. The diodes conduct equally, and the resultant correction voltage at the junction of resistor 62 and 64 is zero. There is no correction applied to the VCO, for when the oscillator signal is 90° out of phase with the color burst, it is in the proper phase for chromaticity demodulation.

A phase difference between the oscillator feedback signal and the color burst reference which is greater than or less than 90° produces at the phase detector output a positive or negative DC correction voltage which is the algebraic sum of the voltages across the two diode load resistors 62 and 64.

In this embodiment, the DC amplifier 20 for processing the error correction voltage is a Darlington amplifier comprising transistors 66 and 68. The base electrode of transistor 66 comprises the amplifier input terminal and is connected to the output of phase detector 18 (the junction of resistors 62 and 64.) The emitter of transistor 66 is connected to the base electrode of transistor 68, and the collector electrodes of the two transistors are connected together and through a resistor 70 to a source of B+ supply voltage represented by terminal 72. The emitter of transistor 68 is connected through a resistor 74 to ground. A resistor 76 and capacitor 78 serially connected in that order between the collector of the Darlington transistors and the base of transistor 66, and a capacitor 80 connected between the base of transistor 66 and ground, function as an active low-pass filter for shaping the frequency response of the Darlington amplifier to establish the desired pull in range and noise bandwidth of the phase lock loop.

The DC control voltage for VCO 10 is provided at the collector output of the Darlington amplifier transistors. Accordingly, the collector junction of transistors 66 and 68 is connected through a DC coupling resistor 82 to the control terminal, in this case the cathode, of varactor diode 14. Also connected at the Darlington output is an AC bypass capacitor 84 to ground.

Varactor 14 provides the voltage responsive variable reactance for the frequency determining circuitry of the voltage-controlled oscillator 10. The VCO frequency determining circuitry further includes a capacitor 86 connected across the varactor for establishing a minimum capacitive reactance for the frequency-determining circuit, and an inductor 88 and crystal 90 serially connected in that order between the cathode of varactor 14 and the input of the active circuitry (either transistor or vacuum tube) of the oscillator represented by block 12. When applied in a colored television receiver, component 90 is a 3.579545 MHz. crystal.

The supply voltage and ambient temperature compensating regulator 22 comprises a transistor 92 having an emitter electrode connected through a resistor 94 to ground and a collector electrode connected through a resistor 96 to a terminal 98, which represents the same source of B+ supply voltage as provided at terminal 72. A feedback resistor 100 is connected between the collector of transistor 92 and its base electrode. The collector of regulator transistor 92 is connected to the anode of varactor 14 to thereby provide the reference potential for the varactor. Thus, varactor 14 functions as a load at the output of the Darlington amplifier with its cathode employed as a control input terminal and its anode employed as the reference terminal. An AC bypass capacitor 102 is connected between the collector of transistor 92 and ground.

The collector output of the regulator transistor 92 is also connected to provide base bias for the Darlington amplifier so as to provide a proper tracking function at the cathode of the varactor 14. In this instance, however, this base bias connection is conveniently provided through the phase detector 18, as the phase detector circuit values are selected to provide the high input impedance required at the base of the Darlington amplifier. In particular, the base bias circuit comprises series resistors 104 and 60 connected between the collector of transistor 92 and the phase detector input represented by the junction of the cathode of diode 52 and the anode of diode 56. Connected between the junction of resistors 60 and 104 and ground is the series combination of a fixed resistor 106 and variable resistor 108. Resistors 104, 106 and 108 comprise a variable-voltage divider for adjusting the bias applied to the DC Darlington amplifier in the absence of a reference signal to thereby establish the free-running frequency of the oscillator. The bias circuit further includes a DC path through the phase detector including diode 56 and resistor 64, and finally the connection between the phase detector output and the base of transistor 66.

In this manner, a change in temperature will be sensed by the regulator transistor and reflected in a variation of the reference potential provided for varactor 14 and the base bias provided to the Darlington stage, thereby appropriately varying the collector voltage of the Darlington to track with the collector voltage of the regulator and thus, for a constant error correction input voltage to the Darlington, tend to keep the voltage across varactor 14 constant. Changes in line voltage will be reflected in a variation of the supply voltage connected to the collectors of both the regulator and Darlington stages. But again, the resulting changes in varactor reference potential and base bias voltage provided by the regulator will provide compensation by causing the collector voltage of the Darlington to track with the collector voltage of the regulator transistor. To provide a satisfactory tracking compromise for both voltage and temperature, the gain of the regulator stage 22 is adjusted by appropriate selection of resistors 94, 96 and 100. Of course, the design of the regulator stage is mutually dependent upon the gain selected for the Darlington amplifier stage.

The tracking function desired in the operation of the above-described compensating circuit and the need for providing a bias path from the regulator to the DC amplifier to maintain this tracking may best be illustrated by reference to the graph of FIG. 3. The horizontal axis has two scales, one being the supply voltage ($V_{cc}$) and the other ambient temperature. The vertical axis represents collector voltage ($V_c$). As labeled, the upper set of curves represent collector voltage variations for the DC amplifier and the lower set of curves represent collector voltage variation for the regulator.

Assume, as indicated, that the nominal supply voltage is 20 volts and the nominal ambient temperature is 25° C.; this coincides with the intersections of both sets of collector voltage curves. Further assume, as indicated, that a difference of voltage ($\Delta V$) across varactor diode 14 under nominal conditions is approximately 5 volts, the voltage at the collector of transistor 68 and cathode of the varactor being approximately 12 volts, with the reference voltage at the collector of transistor 92 and anode of varactor 14 being approximately 7 volts.

The parallel set of positive sloping curves illustrate the ideal "in track" increase in the collector voltages of the regulator and DC amplifier with an increase in the supply voltage alone, a constant error correction input voltage being assumed. The parallel set of negative-sloping curves illustrate the ideal "in track" decrease in the regulator and DC amplifier collector voltages with an increase in the ambient temperature alone, again a constant DC amplifier input being assumed. As previously mentioned, the ideal tracking objective illustrated by the simplified curves of FIG. 3 is approached in the present compensating scheme by providing as the base bias for the DC amplifier the output of a regulator which also provides the reference potential for the varactor load connected at the output of the DC amplifier and has a gain selected to properly achieve these results in cooperation with the gain selected for the DC amplifier. If the DC Darlington amplifier were biased independently, its collector voltage would vary in the same direction as the collector voltage of the regulator, but the slopes of the respective curves would not be parallel, that is the voltages would not track, and an undesired temperature and/or supply voltage induced variation in the voltage across the varactor would result.

The most practical method for approaching the tracking operation discussed above with an optimum compromise for both supply voltage and ambient temperature compensation is to empirically establish the design component values by operating the equipment in a temperature controlled environment with range adjustment for line voltage. The frequency change versus ambient temperature and supply voltage may then be plotted and the parameters of the regulator stage adjusted to minimize the effects on the control signal due to both temperature and supply voltage changes. More specifically, the first step of each two-step trial may comprise holding the ambient temperature constant and adjusting the values of regulator resistors 94, 96 and 100 so that for a supply voltage variation of say ±10 percent about a +20-volt nominal (i.e. 18–22 volts), the output frequency will remain within about ±50 Hz. of the desired 3.579545 MHz. desired as the chromaticity-demodulating signal. The second step of the trial will then comprise holding the supply voltage constant and varying ambient temperature from about 20° to 65° C. in 5° C. increments, the values of resistors 94, 96 and 100 being adjusted to maintain the oscillator output frequency to within ±40 Hz. of the desired nominal over this temperature range. The above described approach may require from ten to fifteen trials to establish the best compromise.

For purposes of example, the following component values and types are employed in a circuit such as that shown on FIG. 2 for obtaining the temperature and supply voltage compensation performance described in the preceding paragraph:

| | |
|---|---|
| B+ supply voltage | 20 volts |
| Darlington Amplifier (transistors 66 and 68) | 2N5306 (integrated circuit) |
| Regulator transistor 92 | 2N3694 |
| Varactor 14 | TI V306 |
| Diodes 52 and 56 | IN4148 |
| Crystal 90 | 3.579545 MHz. |
| Inductor 88 | 33 μhenries |
| Resistor 60 | 1.2 K ohms |
| Resistor 62 | 470 K ohms |
| Resistor 64 | 470 K ohms |
| Resistor 70 | 7.5 K ohms |
| Resistor 74 | 1 K ohms |
| Resistor 76 | 82 K ohms |
| Resistor 82 | 18 K ohms |
| Resistor 94 | 1 K ohms |
| Resistor 96 | 3.3 K ohms |
| Resistor 100 | 220 K ohms |
| Resistor 104 | 120 K ohms |
| Resistor 106 | 22 K ohms |
| Resistor 108 | 120 K ohms |
| Capacitor 50 | 470 pf. |
| Capacitor 54 | 470 pf. |
| Capacitor 58 | 0.001 mfd. |
| Capacitor 78 | 0.05 mfd. |
| Capacitor 80 | 0.01 mfd. |
| Capacitor 84 | 0.0047 mfd. |
| Capacitor 86 | 2.2 pf. |
| Capacitor 102 | 0.0047 mfd. |

In summary, the present invention provides compensation for the effects of both ambient temperature and supply voltage variations upon a transistorized amplifier by the use of a single-regulator circuit which is relatively inexpensive and easily adjusted to provide optimum operation. The invention may be employed in a number of applications, and is particularly useful for stabilizing the transistorized control circuit of a voltage-controlled oscillator, especially as applied in a phase lock loop. The invention is not restricted to the described chromaticity-synchronizing phase lock loop, nor is it limited to control of a Darlington amplifier or use of the circuit values described. Further, although useful in some applications, it is not necessary that the bias connection between the regulator and DC amplifier be applied through the phase detector in a phase lock loop application; a more direct bias path may be employed. In addition, the regulator is not intended to be limited to the compensation of transistorized amplifiers having a variable reactance means as the load. Hence, although the invention has been described with respect to certain embodiments, it will be appreciated that modifications and changes may be made by those skilled in the art without departing from the true spirit and scope of the invention.

I claim:

1. In combination with a transistorized DC amplifier energized by a source of supply voltage and connected between a source of input voltage and a load, a circuit to compensate for ambient temperature and supply voltage variations comprising a transistorized regulator energized by said source of supply voltage and having an output terminal connected to a reference terminal of said load, said load comprising a voltage responsive variable reactance means having a control terminal connected to the output of said DC amplifier and a reference terminal comprising the reference terminal of said load connected to the output of said regulator and a voltage-controlled oscillator connected to said control terminal of said variable reactance means and having phase and frequency control means including said variable reactance means, and circuit means connecting the output of said regulator as a source of bias voltage for said DC amplifier.

2. The combination of claim 1 wherein said variable reactance means comprises a varactor, and said regulator comprises a transistor having collector, base and emitter electrodes, a first resistance means connected between the collector electrode of said regulator transistor and said source of supply voltage, a second resistance means connected between the emitter of said regulator transistor and ground, and a third resistance means connected in a feedback path between the collector and base electrodes of said regulator transistor, the collector of said regulator transistor being connected to the reference terminal of said varactor and through said bias circuit means to the input of said transistorized DC amplifier for providing base bias voltage therefor, and the amount of compensation provided by said regulator being determined by the selected values of said first, second and third resistance means.

3. The combination of claim 2 further including a phase detector having first and second input means and an output, means for coupling a feedback signal from the output of said oscillator to the first input means of said phase detector, and means for applying a reference signal to the second input means of said phase detector, and wherein: the output of said phase detector is connected to the input of said DC amplifier as said source of input voltage; said phase detector provides a high-input impedance for said DC amplifier; and said circuit means for providing base bias voltage to said DC amplifier comprises means connecting the collector of said regulator transistor to the first input means of said phase detector, a DC circuit path through said phase detector from its first input means to its output, and the connection of the output of said phase detector to the input of said DC amplifier; said combination thereby comprising a temperature- and voltage-compensated phase lock loop in which said phase detector is operative in response to an undesired difference in phase between said reference signal and said feedback signal to produce an error signal which is applied via said DC amplifier to said varactor for controlling the phase and frequency of said oscillator.

4. The combination of claim 3 wherein said DC amplifier is a transistorized Darlington amplifier.

5. The combination of claim 1 further including a phase detector having first and second input means and an output, said detector output being connected to the input of said DC amplifier as said source of input voltage, means for coupling a feedback signal from the output of said oscillator to the first input means of said phase detector, and means for applying a reference signal to the second input means of said phase detector, said combination thereby comprising a temperature- and voltage-compensated phase lock loop in which said phase detector is operative in response to an undesired difference in phase between said reference signal and said feedback signal to produce an error signal which is applied via said DC amplifier to said variable reactance means for controlling the phase and frequency of said oscillator.

6. The combination of claim 5 wherein said circuit means for providing bias voltage to said DC amplifier comprises means connecting the output of said regulator to the first input means of said phase detector, a DC circuit path through said phase detector from its first input means to its output, and the connection of the output of said phase detector to the input of said DC amplifier.

7. The combination of claim 6 wherein said means connecting the output of said regulator to the first input means of said phase detector includes a variable-voltage divider for adjusting the bias applied to said DC amplifier in the absence of a reference signal to thereby establish the free-running frequency of said oscillator.

8. In a color television receiver including means for deriving chrominance information signals from a subcarrier signal modulated by the chrominance information, said means including a chroma amplifier, a demodulator, and a phase lock loop including a phase detector connected to said chroma amplifier and a voltage controlled oscillator connected to said demodulator and to said phase detector, a circuit for controlling said oscillator comprising:

a transistorized DC amplifier having an input connected to said phase detector and an output;

a transistorized regulator having an output;

a source of supply voltage connected to said DC amplifier and said regulator for energization thereof;

a voltage responsive variable reactance means having an input connected to the output of said DC amplifier and an output connected to said oscillator for controlling the phase and frequency thereof; and circuit means connecting the output of said regulator to said variable reactance means and as a source of bias voltage for said DC amplifier for compensating for ambient temperature and supply voltage variations.

9. The circuit of claim 8 wherein said variable reactance means includes a varactor diode connected between the output of said DC amplifier and the output of said regulator.

10. The circuit of claim 9 wherein said transistorized regulator is a transistor amplifier the gain of which is selected to maintain a substantially constant voltage difference across said varactor diode over selected ranges of supply voltage and ambient temperature variations when the voltage provided at the input of said DC amplifier by said phase detector is constant.

11. The circuit of claim 8 wherein said circuit means connecting the output of said regulator as a source of bias voltage for said DC amplifier includes means connecting the output of said regulator to said phase detector, said phase detector providing a DC bias path therethrough to the input of said DC amplifier.

* * * * *

PO-1050
(5/69)

UNITED STATES PATENT OFFICE
CERTIFICATE OF CORRECTION

Patent No. 3,619,803 Dated November 9, 1971

Inventor(s) ARTHUR HAROLD KLEIN

It is certified that error appears in the above-identified patent and that said Letters Patent are hereby corrected as shown below:

Abstract, line 8 "of" should read --or--.

Delete the following figure on the Front Page of the patent which comprises no part of this patent.

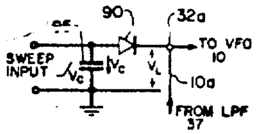

Column 3, line 70 of the specification "compensate" should read--compensated--.

Column 5, line 45 of the specification "9 degrees" should read--90 degrees--.

Signed and sealed this 16th day of May 1972.

(SEAL)
Attest:

EDWARD M.FLETCHER,JR.
Attesting Officer

ROBERT GOTTSCHALK
Commissioner of Patents